(12) United States Patent
Nakabayashi et al.

(10) Patent No.: US 12,003,187 B2
(45) Date of Patent: Jun. 4, 2024

(54) POWER CONVERSION APPARATUS

(71) Applicant: TMEIC Corporation, Chuo-ku (JP)

(72) Inventors: Shigeyuki Nakabayashi, Chuo-ku (JP); Ikuto Udagawa, Chuo-ku (JP)

(73) Assignee: TMEIC Corporation, Chuo-ku (JP)

( * ) Notice: Subject to any disclaimer, the term of this patent is extended or adjusted under 35 U.S.C. 154(b) by 131 days.

(21) Appl. No.: 17/770,684

(22) PCT Filed: Apr. 23, 2020

(86) PCT No.: PCT/JP2020/017557
§ 371 (c)(1),
(2) Date: Apr. 21, 2022

(87) PCT Pub. No.: WO2021/214951
PCT Pub. Date: Oct. 28, 2021

(65) Prior Publication Data
US 2022/0376630 A1   Nov. 24, 2022

(51) Int. Cl.
*H02M 7/00* (2006.01)
*H01B 17/56* (2006.01)
*H05K 7/02* (2006.01)
*H05K 7/14* (2006.01)

(52) U.S. Cl.
CPC ............ *H02M 7/003* (2013.01); *H01B 17/56* (2013.01); *H05K 7/023* (2013.01); *H05K 7/1432* (2013.01)

(58) Field of Classification Search
CPC ....... H02M 7/003; H01B 17/56; H05K 7/023; H05K 7/1432
See application file for complete search history.

(56) References Cited

U.S. PATENT DOCUMENTS

| 6,161,277 A * | 12/2000 | Asai ...................... H05K 13/041 198/586 |
| 2011/0181105 A1* | 7/2011 | Michinaka ........... H05K 7/1432 307/9.1 |
| 2011/0194249 A1* | 8/2011 | Nakasaka .......... H05K 7/20927 361/689 |

(Continued)

FOREIGN PATENT DOCUMENTS

| JP | 63-30231 Y2 | 8/1998 |
| JP | 2006-345590 A | 12/2006 |

(Continued)

OTHER PUBLICATIONS

International Search Report dated Jul. 14, 2020 in PCT/JP2020/017557 filed on April 23, 2020.

(Continued)

*Primary Examiner* — Yusef A Ahmed
(74) *Attorney, Agent, or Firm* — Oblon, McClelland, Maier & Neustadt, L.L.P.

(57) ABSTRACT

A power conversion apparatus includes a plurality of power conversion units each including a power conversion module, the plurality of power conversion units being arranged at an interval in a lateral direction orthogonal to a vertical direction, and at least one support body that extends from one side toward the other side of the plurality of power conversion units in the lateral direction, on which the plurality of power conversion units are placed from above. The support body is formed from an insulating member.

4 Claims, 5 Drawing Sheets

(56) References Cited

U.S. PATENT DOCUMENTS

| | | | | |
|---|---|---|---|---|
| 2013/0094269 | A1* | 4/2013 | Maeda | H05K 7/14322 363/141 |
| 2013/0322016 | A1* | 12/2013 | Jones | H05K 7/14339 361/689 |
| 2014/0092663 | A1* | 4/2014 | Shimizu | H05K 7/20254 363/141 |
| 2014/0334102 | A1* | 11/2014 | Tanaka | H05K 7/20236 361/699 |
| 2016/0218333 | A1* | 7/2016 | Takasaki | H01M 50/367 |
| 2016/0226396 | A1* | 8/2016 | Hattori | H02M 7/53871 |
| 2016/0241156 | A1* | 8/2016 | Kawakami | H02M 3/04 |
| 2016/0373017 | A1* | 12/2016 | Mima | H02M 7/2173 |
| 2019/0173394 | A1* | 6/2019 | Miura | H02M 1/08 |
| 2020/0113093 | A1* | 4/2020 | Nakabayashi | H02M 7/483 |
| 2020/0120830 | A1* | 4/2020 | Song | H01L 23/40 |
| 2020/0350830 | A1* | 11/2020 | Hano | H02M 7/537 |
| 2021/0273576 | A1* | 9/2021 | Nakabayashi | H02M 7/4835 |
| 2023/0020139 | A1* | 1/2023 | Yamane | H02M 7/003 |

FOREIGN PATENT DOCUMENTS

| | | |
|---|---|---|
| JP | 2007-306793 A | 11/2007 |
| JP | 2019-160820 A | 9/2019 |
| WO | WO 2019/003432 A1 | 1/2019 |

OTHER PUBLICATIONS

Japanese Office Action dated Jul. 6, 2021 in Japanese Patent Application No. 2020-557363 (with unedited computer generated English translation), 9 pages.

Written Opinion of the International Searching Authority dated Jul. 14, 2020 in PCT/JP2020/017557 (with English translation), 9 pages.

\* cited by examiner

POWER CONVERSION APPARATUS

TECHNICAL FIELD

The present disclosure relates to a power conversion apparatus.

BACKGROUND ART

In a conventional power conversion apparatus, as disclosed in Japanese Patent Laying-Open No. 2019-160820 (PTL 1) and Japanese Utility Model Publication No. 63-030231 (PTL 2), a plurality of power conversion units are stacked with an insulating column such as an insulator being interposed.

CITATION LIST

Patent Literature

PTL 1: Japanese Patent Laying-Open No. 2019-160820
PTL 2: Japanese Utility Model Publication No. 63-030231

SUMMARY OF INVENTION

Technical Problem

In laterally arranging a plurality of power conversion units, a support structure for supporting the plurality of power conversion units together is required. Since the plurality of power conversion units are considerably heavy, a stronger structure is required.

Strength of the support structure can be ensured by forming the support structure of a metal material. In this case, however, in order to ensure a breakdown voltage between the support structure and the power conversion units, an insulating member such as an insulator should be arranged between the plurality of power conversion units and the support structure.

In this case, a height of the insulating member is added to increase the height of the power conversion apparatus. Furthermore, also in assembling the power conversion apparatus, time and efforts for attaching the insulating member between the plurality of power conversion units and the support structure are required.

The present disclosure was made in view of the problems as above, and an object of the present disclosure is to provide a power conversion apparatus lower in height and improved in ease of assembly.

Solution to Problem

A power conversion apparatus based on the present disclosure includes a plurality of power conversion units each including a power conversion module, the plurality of power conversion units being arranged at an interval in a lateral direction orthogonal to a vertical direction, and at least one support body that extends from one side toward the other side of the plurality of power conversion units in the lateral direction, on which the plurality of power conversion units are placed from above. The support body is formed from an insulating member.

In the power conversion apparatus based on the present disclosure, the support body includes an upper surface opposed to the plurality of power conversion units. In this case, a portion of the upper surface located between adjacent power conversion units may be provided with surface irregularities.

In the power conversion apparatus based on the present disclosure, the support body includes an upper surface opposed to the plurality of power conversion units. In this case, the upper surface may include a first region where the plurality of power conversion units are placed and a second region located between adjacent power conversion units in the upper surface, and a height difference may be provided between the first region and the second region.

In the power conversion apparatus based on the present disclosure, the at least one support body may include a plurality of support bodies. In this case, preferably, the plurality of support bodies are arranged as being aligned in a front-rear direction orthogonal to the vertical direction and the lateral direction. Furthermore, preferably, a length of the support body in the vertical direction is longer than a length of the support body in the front-rear direction.

In the power conversion apparatus based on the present disclosure, each of the plurality of power conversion units may include a slide guide that slidably holds the power conversion module in a front-rear direction orthogonal to the vertical direction and the lateral direction. In this case, the slide guide may include a mount portion that supports the power conversion unit and a leg that supports the mount portion from below and abuts on the support body. Furthermore, in this case, preferably, the leg is located on an inner side of opposing ends of the power conversion module in the lateral direction when viewed in the front-rear direction.

In the power conversion apparatus based on the present disclosure, preferably, a plurality of basic units each including the plurality of power conversion units and the at least one support body are arranged as being aligned in the vertical direction.

Advantageous Effects of Invention

According to the present disclosure, a power conversion apparatus lower in height and improved in ease of assembly can be provided.

DESCRIPTION OF EMBODIMENTS

Figure 1:
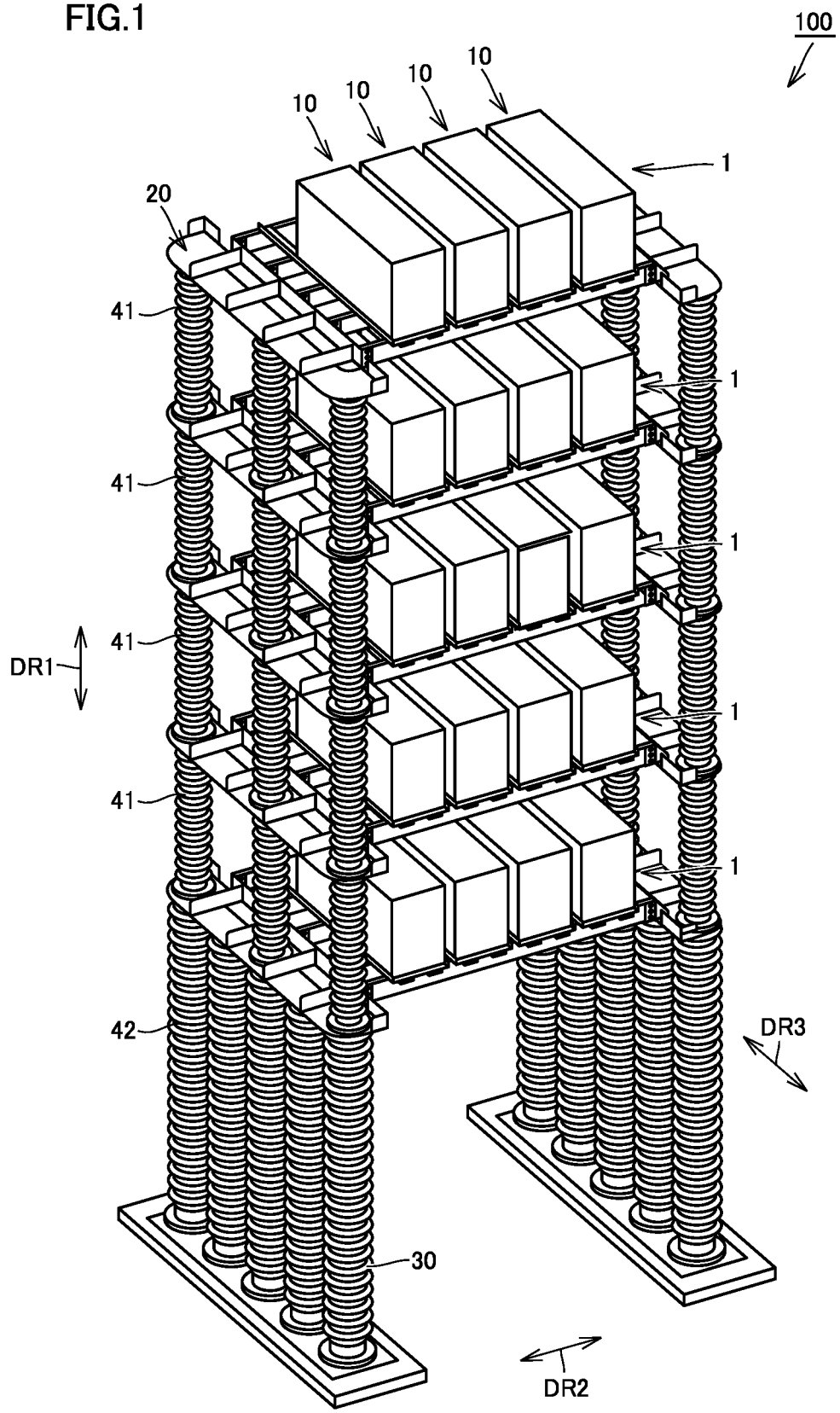
FIG. 1 is a schematic perspective view showing a power conversion apparatus according to a first embodiment.

Embodiments of the present disclosure will be described below in detail with reference to the drawings. In the embodiments shown below, the same or common elements in the drawings have the same reference characters allotted and description thereof will not be repeated.

(First Embodiment)

FIG. 1 is a schematic perspective view showing a power conversion apparatus according to a first embodiment. A power conversion apparatus 100 according to the first embodiment will be described with reference to FIG. 1.

As shown in FIG. 1, power conversion apparatus 100 includes a plurality of basic units 1, a base 30, a plurality of stage columns 41, and a plurality of base columns 42. Power conversion apparatus 100 is constructed of the plurality of basic units 1 arranged as being aligned in a vertical direction (a DR1 direction in FIG. 1).

Each of the plurality of basic units 1 includes a plurality of power conversion units 10 and a stage unit 20 that supports the plurality of power conversion units 10 from below. The plurality of power conversion units 10 are arranged as being aligned in a lateral direction (a DR2 direction in FIG. 1) orthogonal to the vertical direction.

Stage unit 20 includes a portion that protrudes toward the outside of the plurality of power conversion units 10 in the lateral direction and the protruding portion is supported by the plurality of stage columns 41.

The plurality of stage columns 41 are arranged between basic units 1 adjacent in the vertical direction. The plurality of stage columns 41 are provided to extend in the vertical direction. The plurality of stage columns 41 include an insulator in an outer circumferential portion.

The plurality of base columns 42 are arranged between basic unit 1 located at a lowermost position and base 30 installed on an installation surface. The plurality of base columns 42 are provided to extend in the vertical direction. The plurality of base columns 42 include an insulator in an outer circumferential portion.

Though an example in which four power conversion units 10 are arranged as being aligned in the lateral direction within basic unit 1 is illustrated in FIG. 1, the number of power conversion units 10 can be modified as appropriate.

Though an example in which a single basic unit 1 is arranged in a plane orthogonal to the vertical direction is illustrated, without being limited as such, a plurality of basic units 1 may be arranged as being aligned in the plane. For example, a plurality of basic units 1 may be arranged as being aligned in the DR2 direction or arranged as being aligned in a DR3 direction (front-rear direction) orthogonal to the DR1 direction and the DR2 direction. Alternatively, basic units 1 may be arranged in rows and columns in the DR2 direction and the DR3 direction.

Though an example in which power conversion apparatus 100 is constructed of basic units 1 arranged as being aligned in five stages in the vertical direction is illustrated in FIG. 1, the power conversion apparatus is not limited as such. Power conversion apparatus 100 may be constructed of basic units 1 in only a single stage or basic units 1 in two to four stages. Alternatively, power conversion apparatus 100 may be constructed of basic units 1 in at least six stages.

Figure 2:
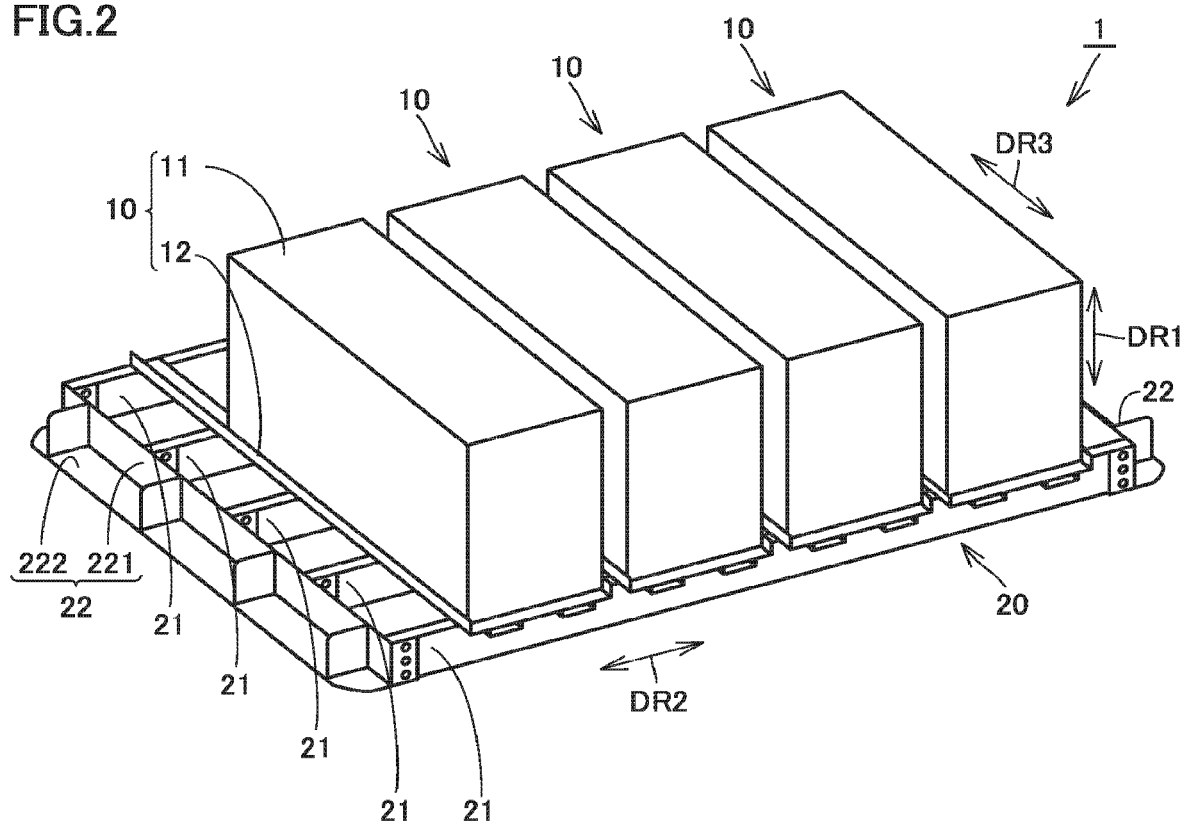
FIG. 2 is a schematic perspective view showing a state that a plurality of power conversion units are placed on a stage unit in a basic unit provided in the power conversion apparatus according to the first embodiment.
Figure 3:
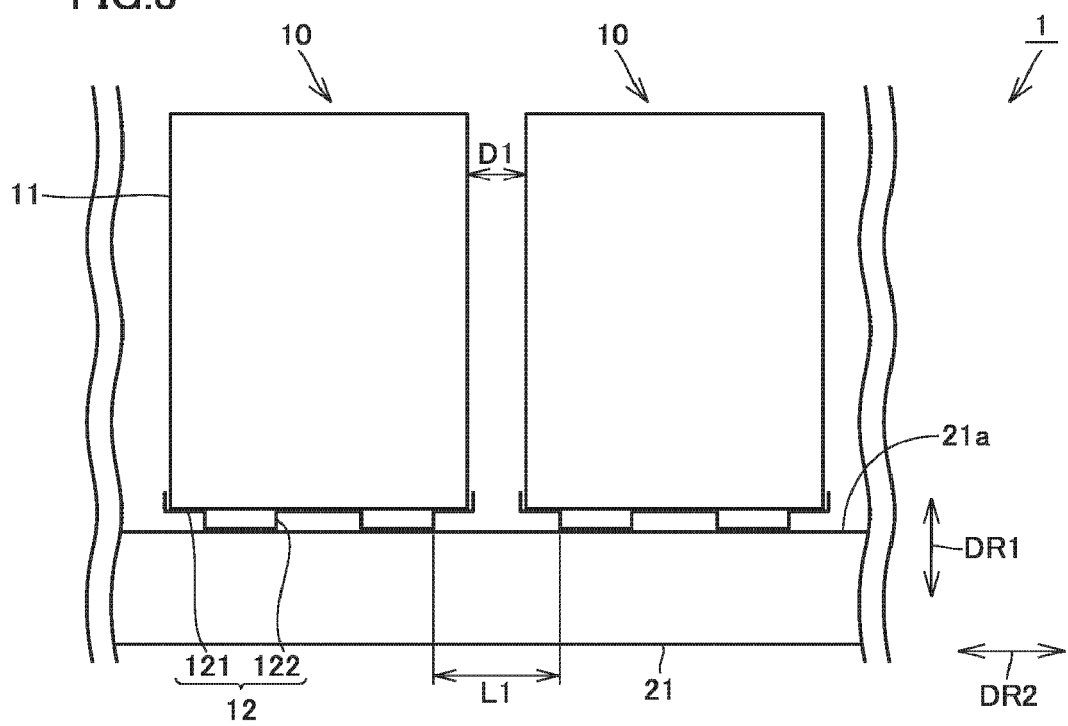
FIG. 3 is a schematic plan view showing the state that the plurality of power conversion units are placed on the stage unit in the basic unit provided in the power conversion apparatus according to the first embodiment.

FIGS. 2 and 3 are a schematic perspective view and a schematic plan view showing a state that the plurality of power conversion units are placed on the stage unit in the basic unit provided in the power conversion apparatus according to the first embodiment, respectively. Details of basic unit 1 will be described with reference to FIGS. 2 and 3.

As shown in FIG. 2, basic unit 1 includes the plurality of power conversion units 10 and stage unit 20 as described above. Each of the plurality of power conversion units 10 includes a power conversion module 11 and a slide guide 12.

Power conversion module 11 is, for example, a thyristor stack where a housing that forms a contour of power conversion module 11, a heat generating device accommodated in the housing, and an electrical component different from the heat generating device are accommodated. Examples of the heat generating device include a semiconductor element. Examples of the electrical component include a control board on which a semiconductor element is formed. Examples of the semiconductor element include a power semiconductor, and the semiconductor element is arranged as being in contact with a water cooling fin through which cooling water can circulate.

Slide guide 12 holds power conversion module 11 as being slidable in the DR3 direction. By pulling out power conversion module 11 by means of such slide guide 12, maintenance such as replacement of power conversion module 11 can be facilitated.

Stage unit 20 includes at least one support body 21 and a pair of frames 22 that holds at least one support body 21.

At least one support body 21 includes a plurality of support bodies 21, and more specifically, includes five support bodies 21. The plurality of support bodies 21 are arranged as being aligned at a distance in the DR3 direction. By thus arranging the plurality of support bodies 21 as being aligned at a distance, stage unit 20 can be lighter in weight.

The plurality of support bodies 21 are each formed from an insulating member. Any insulating member with load-carrying capacity can be adopted as appropriate. For example, a resin member made of a synthetic resin can be adopted as the insulating member. More specifically, a glass epoxy resin can be adopted.

Each of the plurality of support bodies 21 extends from one side toward the other side of the plurality of power conversion units 10 in the DR2 direction. More specifically, each of the plurality of support bodies 21 extends in a direction in parallel to the DR2 direction. The plurality of power conversion units 10 are placed on the plurality of support bodies 21.

The pair of frames 22 is arranged on opposing end sides of the plurality of support bodies 21 in the DR2 direction and holds the plurality of support bodies 21. The pair of frames 22 is made of a metal material and firmly holds support bodies 21. Rigidity of stage unit 20 as a whole can thus be enhanced.

Each of the pair of frames 22 includes a wall 221 to which the plurality of support bodies 21 are fixed and a flange 222 supported by stage columns 41 or base columns 42 described above.

Wall 221 extends along the DR3 direction. Flange 222 extends from a lower end of wall 221 to a side opposite to a side where the plurality of power conversion units 10 are located. Flange 222 is substantially in parallel to the DR2 direction and the DR3 direction.

One end side of each of the plurality of support bodies 21 in the DR2 direction is fixed to wall 221 of one frame 22 of the pair of frames 22. The other end side of each of the plurality of support bodies 21 in the DR2 direction is fixed to wall 221 of the other frame 22 of the pair of frames 22. Each of the plurality of support bodies 21 is fixed to wall 221 by a fastening member such as a screw.

As shown in FIGS. 2 and 3, each of the plurality of support bodies 21 is in a shape of a plate. A length of support body 21 in the DR1 direction is longer than a length of support body 21 in the DR3 direction. Strength and rigidity of support body 21 in the vertical direction can thus be enhanced. Therefore, even when the plurality of power conversion units 10 are placed on the plurality of support bodies 21, warpage of support bodies 21 in the vertical direction can be suppressed. Consequently, quake resistance in the vertical direction can be improved.

Support body 21 includes an upper surface 21a opposed to the plurality of power conversion units 10. In the first embodiment, upper surface 21a is formed as being flat from one end side toward the other end side in the DR2 direction.

As shown in FIG. 3, slide guide 12 described above more specifically includes a mount portion 121 that supports power conversion module 11 and a leg 122 that supports mount portion 121. Mount portion 121 and leg 122 are made of a conductive metal material.

Mount portion 121 includes a rail that guides movement of a sliding portion provided in a housing of the power conversion module. The rail is provided to extend along the DR3 direction. Leg 122 supports mount portion 121 from below. Leg 122 extends along the DR3 direction. Leg 122 is provided to extend across the plurality of support bodies 21. Leg 122 is arranged between mount portion 121 and support body 21 and abuts on support body 21.

Leg 122 is located on an inner side of opposing ends of power conversion module 11 in the DR2 direction when viewed in the DR3 direction.

Between power conversion units 10 adjacent in the DR2 direction, a desired creepage distance is ensured depending on a maximum potential difference produced therebetween. As leg 122 is located on the inner side of power conversion module 11 in the DR2 direction as above, a distance L1 between closest legs 122 in adjacent power conversion units 10 can be longer than a distance D1 between power conversion modules 11 in the DR2 direction. The creepage distance along support body 21 can thus be longer.

Figure 4:
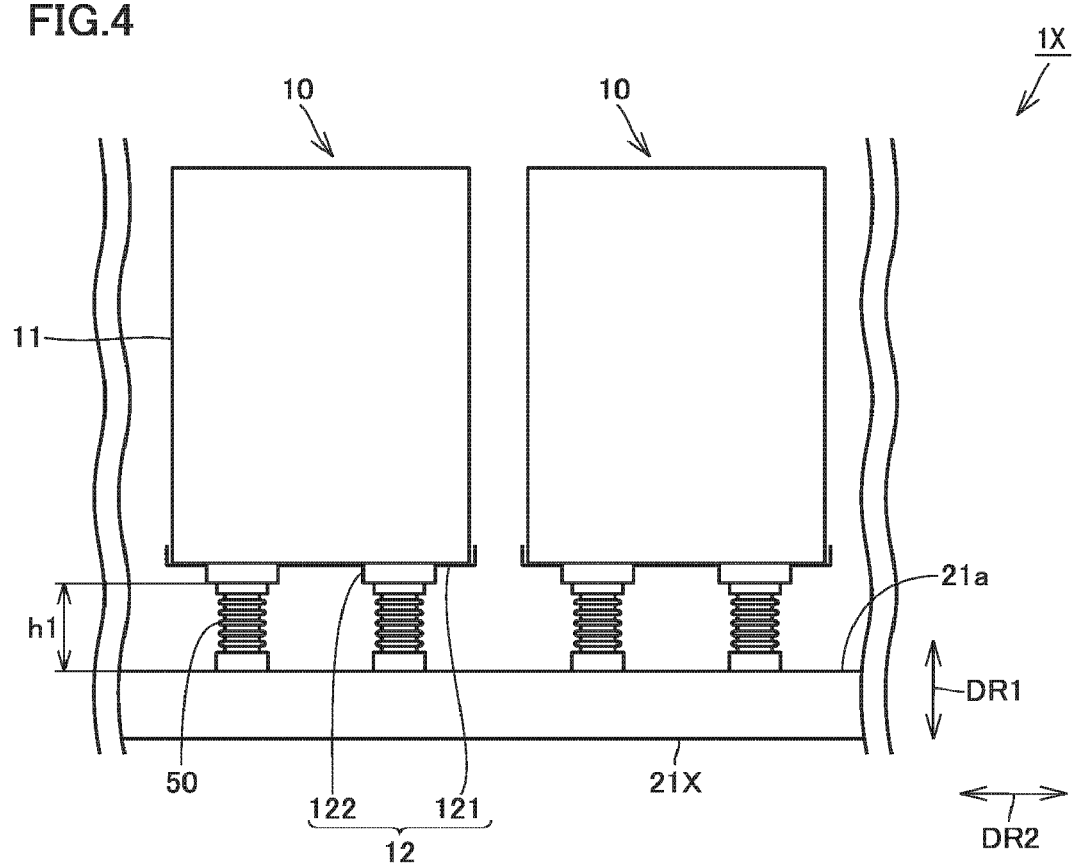
FIG. 4 is a schematic plan view showing a state that a plurality of power conversion units are placed on a stage unit in a basic unit provided in a power conversion apparatus according to a comparative example.

FIG. 4 is a schematic plan view showing a state that a plurality of power conversion units are placed on a stage unit in a basic unit provided in a power conversion apparatus according to a comparative example. The power conversion apparatus according to the comparative example will be described with reference to FIG. 4.

As shown in FIG. 4, the power conversion apparatus according to the comparative example is different from power conversion apparatus 100 according to the first embodiment in construction of a basic unit 1X. Specifically, in basic unit 1X, a support body 21X is made of a conductive metal material and an insulator 50 is interposed between each of the plurality of power conversion units 10 and support body 21X.

In such a case, a creepage distance should be ensured by insulator 50 in a height direction (the DR1 direction). Therefore, a height h1 of insulator 50 is added to increase the height of basic unit 1X. When a plurality of basic units 1X are arranged as being aligned in the DR1 direction, heights h1 of a plurality of insulators 50 arranged as being aligned in the vertical direction are added and hence the power conversion apparatus further increases in height.

In contrast, in the first embodiment, while the desired creepage distance is ensured along support body 21 as described above, the plurality of power conversion units 10 are directly placed on support body 21 formed from the insulating member. Insulator 50 thus does not have to be provided as compared with the comparative example.

Therefore, basic unit 1 can be lower in height in the first embodiment. By arranging basic units 1 lower in height as being aligned in the vertical direction, power conversion apparatus 100 can more effectively be lower in height.

In addition, since an insulator does not have to be provided as compared with the comparative example, time for works required for attachment of the insulator can also be reduced. The number of parts can be reduced and manufacturing cost can also be reduced. Therefore, ease in assembly of basic unit 1 and power conversion apparatus 100 can significantly be improved.

(Second Embodiment)

Figure 5:
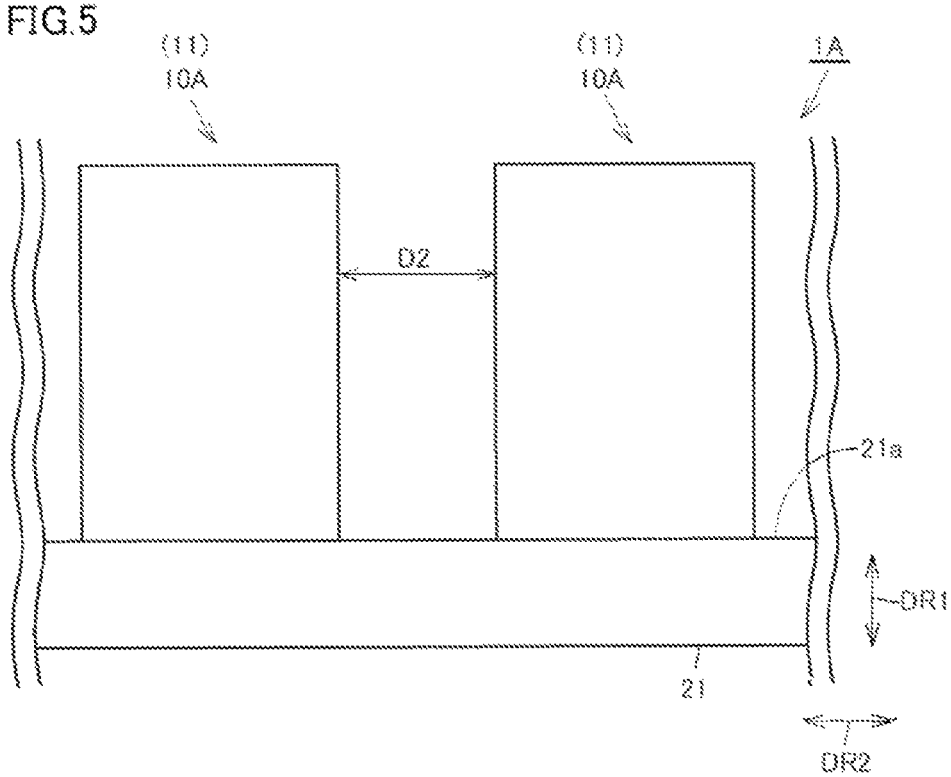
FIG. 5 is a schematic plan view showing a state that a plurality of power conversion units are placed on a stage unit in a basic unit provided in a power conversion apparatus according to a second embodiment.

FIG. 5 is a schematic plan view showing a state that a plurality of power conversion units are placed on a stage unit in a basic unit provided in a power conversion apparatus according to a second embodiment. The power conversion apparatus according to the second embodiment will be described with reference to FIG. 5.

As shown in FIG. 5, the power conversion apparatus according to the second embodiment is different from power conversion apparatus 100 according to the first embodiment in construction of a power conversion unit 10A and otherwise substantially similar thereto.

Specifically, power conversion unit 10A is different from power conversion unit 10 according to the first embodiment in not including slide guide 12. In other words, power conversion module 11 is directly placed on support body 21.

Therefore, the power conversion apparatus according to the second embodiment can further be lower in height than power conversion apparatus 100 according to the first embodiment. Since installation of slide guide 12 is not required, time for assembly works can be reduced and manufacturing cost can also be reduced.

Unlike leg 122 of slide guide 12 in the first embodiment, a housing that forms a contour of power conversion unit 10A serves as a portion of contact of power conversion unit 10A with support body 21. Therefore, the creepage distance should be ensured between housings of power conversion units 10A. A distance D2 between adjacent power conversion modules 11 is longer than distance D1 between the power conversion modules in the first embodiment.

(Third Embodiment)

Figure 6:
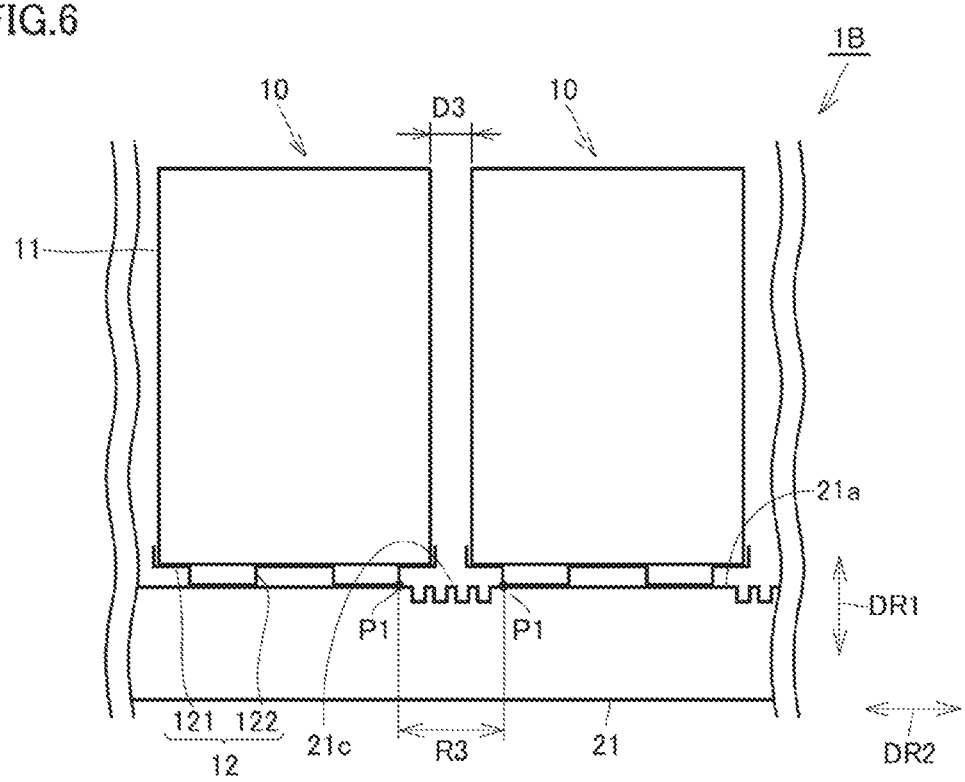
FIG. 6 is a schematic plan view showing a state that a plurality of power conversion units are placed on a stage unit in a basic unit provided in a power conversion apparatus according to a third embodiment.

FIG. 6 is a schematic plan view showing a state that a plurality of power conversion units are placed on a stage unit in a basic unit provided in a power conversion apparatus according to a third embodiment. The power conversion apparatus according to the third embodiment will be described with reference to FIG. 6.

As shown in FIG. 6, the power conversion apparatus according to the third embodiment is different from power conversion apparatus 100 according to the first embodiment in shape of upper surface 21a of support body 21 in a basic unit 1B and otherwise substantially similar thereto.

Specifically, in the third embodiment, a portion R3 in upper surface 21a located between adjacent power conversion units is provided with surface irregularities 21c. Portion R3 in upper surface 21a located between adjacent power conversion units 10 is a portion located between lower ends P1 of power conversion units 10 in contact with support body 21.

According to such a construction as well, an effect substantially similar to the effect of power conversion apparatus 100 according to the first embodiment is obtained.

In addition, in the third embodiment, surface irregularities 21c are provided so that the creepage distance along support body 21 can be longer. Therefore, a distance D3 between power conversion modules 11 adjacent in the DR2 direction can be shorter than distance D1 between power conversion modules 11 in the first embodiment. In other words, the power conversion apparatus according to the third embodiment can be smaller in width in the DR2 direction. Distance D3 may be as long as distance D1.

(Fourth Embodiment)

Figure 7:
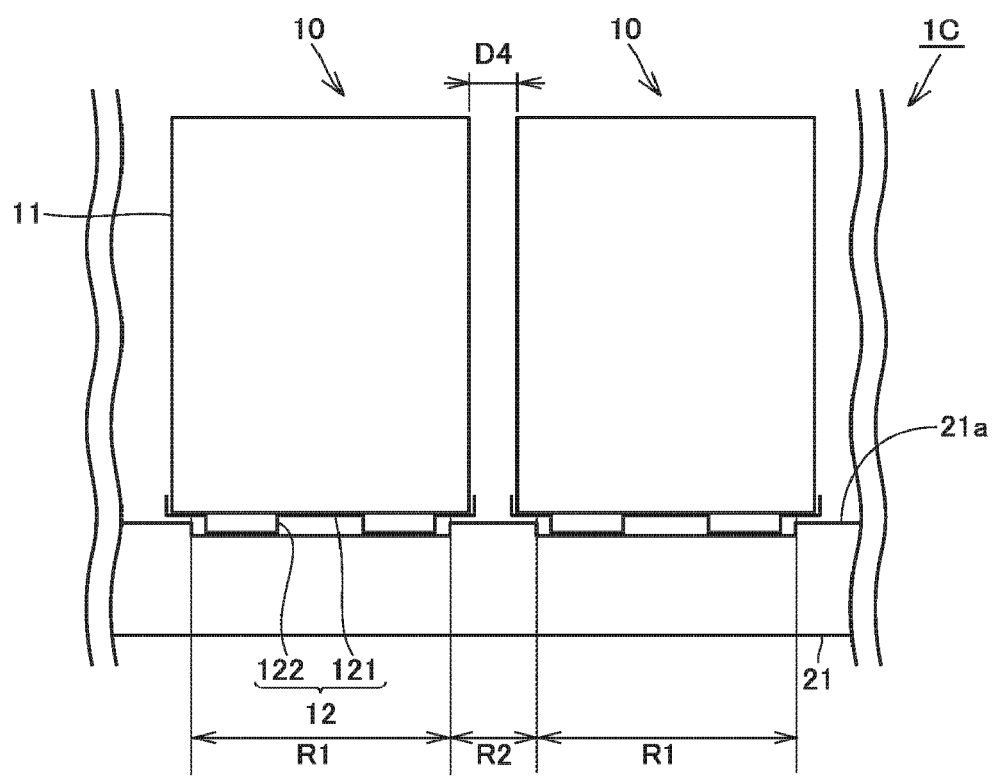
FIG. 7 is a schematic plan view showing a state that a plurality of power conversion units are placed on a stage unit in a basic unit provided in a power conversion apparatus according to a fourth embodiment.

FIG. 7 is a schematic plan view showing a state that a plurality of power conversion units are placed on a stage unit in a basic unit provided in a power conversion apparatus according to a fourth embodiment. The power conversion apparatus according to the fourth embodiment will be described with reference to FIG. 7.

As shown in FIG. 7, the power conversion apparatus according to the fourth embodiment is different from power conversion apparatus 100 according to the first embodiment in shape of upper surface 21a of support body 21 in a basic unit 1C and otherwise substantially similar thereto.

Specifically, upper surface 21a includes a first region R1 where the plurality of power conversion units 10 are placed and a second region R2 located between adjacent power conversion units 10, and a height difference is formed between first region R1 and second region R2. Though an example in which first region R1 is recessed in a thickness direction relative to second region R2 is illustrated in FIG. 7 by way of example, second region R2 may be recessed in the thickness direction relative to first region R1.

According to such a construction as well, an effect substantially similar to the effect of power conversion apparatus 100 according to the first embodiment is obtained.

In addition, in the fourth embodiment, the height difference is formed between first region R1 and second region R2 so that the creepage distance along support body 21 can be longer. Therefore, a distance D4 between power conversion modules 11 adjacent in the DR2 direction can be shorter than distance D1 between power conversion modules 11 in the first embodiment. In other words, the power conversion apparatus according to the fourth embodiment can be smaller in width in the DR2 direction. Distance D4 may be as long as distance D1.

As set forth above, the embodiments disclosed herein are illustrative and non-restrictive in every respect. The scope of the present invention is defined by the terms of the claims and is intended to include any modifications within the scope and meaning equivalent to the terms of the claims.

REFERENCE SIGNS LIST 1, 1B, 1X basic unit; 10, 10A power conversion unit; 11 power conversion module; 12 slide guide; 20 stage unit; 21, 21X support body; 21a upper surface; 21c surface irregularities; 22 frame; 30 base; 41 stage column; 42 base column; 50 insulator; 100 power conversion apparatus; 121 mount portion; 122 leg; 221 wall; 222 flange

The invention claimed is:

1. A power conversion apparatus comprising:
a plurality of power conversion units each including a power conversion module, the plurality of power conversion units being arranged at an interval in a lateral direction orthogonal to a vertical direction; and
at least one support body that extends from one side toward the other side of the plurality of power conversion units in the lateral direction, on which the plurality of power conversion units are placed from above,
at least one support body being formed from an insulating member,
wherein the at least one support body includes an upper surface opposed to the plurality of power conversion units,
wherein the upper surface includes a first region where the plurality of power conversion units are placed and a second region located between adjacent power conversion units of the plurality of power conversion units,
wherein a height difference is provided between the first region and the second region,
wherein each of the plurality of power conversion units includes a slide guide that slidably holds the respective power conversion module in a front-rear direction orthogonal to the vertical direction and the lateral direction,
wherein the slide guide includes a mount portion that supports the respective power conversion unit of the plurality of power conversion units and a leg that supports the mount portion from below and abuts on the at least one support body, and
wherein the leg is located on an inner side of opposing ends of the respective power conversion module in the lateral direction when viewed in the front-rear direction.

2. The power conversion apparatus according to claim 1, wherein
a portion of the upper surface located between the adjacent power conversion units of the plurality of power conversion units is provided with surface irregularities.

3. The power conversion apparatus according to claim 1, wherein
the at least one support body includes a plurality of support bodies,
the plurality of support bodies are arranged as being aligned in the front-rear direction orthogonal to the vertical direction and the lateral direction, and
a length of each support body of the plurality of support bodies in the vertical direction is longer than a length of the respective support body of the plurality of support bodies in the front-rear direction.

4. The power conversion apparatus according to claim 1, wherein
a plurality of basic units, each including the plurality of power conversion units and the at least one support body, are arranged as being aligned in the vertical direction.

* * * * *